Figure 1:
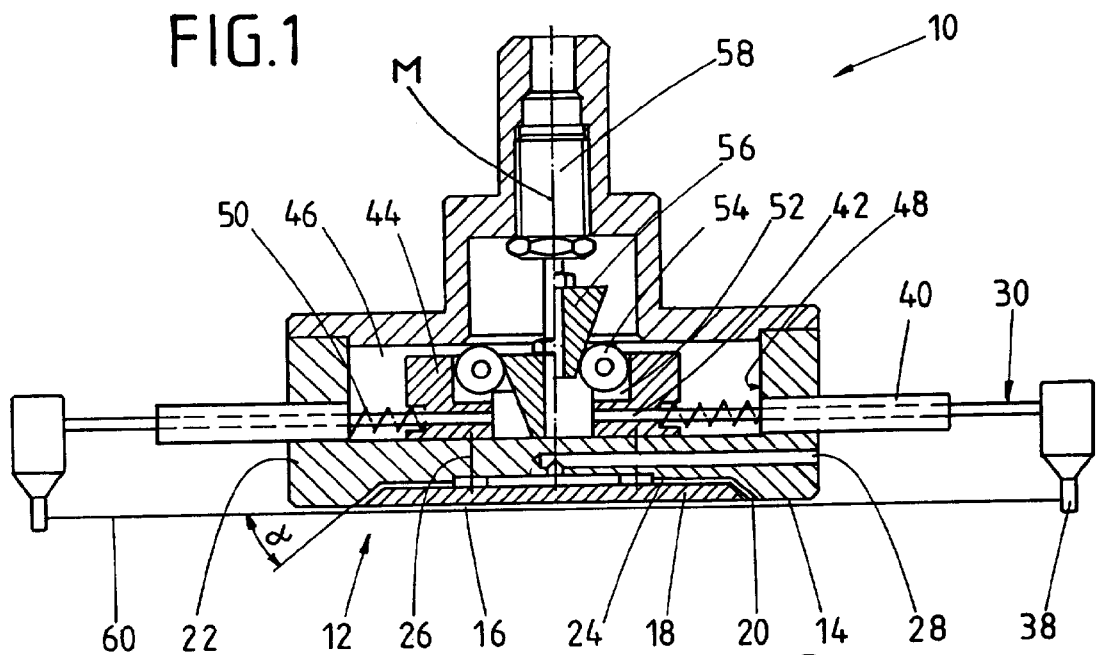

United States Patent
Pirker

[11] Patent Number: 6,152,507
[45] Date of Patent: Nov. 28, 2000

[54] CONVEYING DEVICE FOR THIN DISK-LIKE ARTICLES

[75] Inventor: Willibald Pirker, Bad Bleiberg, Austria

[73] Assignee: SEZ Semicondcutor Equipment Zubehor fur Die Halbleiterfertigung AG, Austria

[21] Appl. No.: 09/211,414

[22] Filed: Dec. 15, 1998

[30] Foreign Application Priority Data

Dec. 16, 1997 [DE] Germany ............ 197 55 694

[51] Int. Cl.⁷ .................. B25J 15/06; B25J 15/10
[52] U.S. Cl. ............... 294/64.3; 294/2; 294/119.1; 414/941
[58] Field of Search .................. 294/2, 64.1, 64.3, 294/119.1; 118/503; 269/21, 34, 153, 234; 271/97, 98, 195; 279/110, 121; 414/741, 941; 901/37, 39, 40

[56] References Cited

U.S. PATENT DOCUMENTS

| | | | |
|---|---|---|---|
| 3,438,668 | 4/1969 | Olsson et al. | 294/64.3 |
| 4,118,058 | 10/1978 | Rahn et al. | 294/64.3 |
| 4,453,757 | 6/1984 | Soraoka | 294/119.1 |
| 5,106,138 | 4/1992 | Lawson | 294/119.1 X |
| 5,520,501 | 5/1996 | Kouno et al. | 294/119.1 X |
| 5,762,391 | 6/1998 | Sumnitsch | 294/119.1 |

FOREIGN PATENT DOCUMENTS

| | | | |
|---|---|---|---|
| 2156651 | 6/1990 | Japan | 294/64.3 |
| 3238245 | 10/1991 | Japan | 294/64.3 |

*Primary Examiner*—Johnny D. Cherry
*Attorney, Agent, or Firm*—John F. A. Earley; John F. A. Earley, III; Harding, Earley, Follmer & Frailey

[57] ABSTRACT

A conveying device for thin disk-like articles (60), characterized by the following features: a support (10) having a plain surface (12), in the support (10) there is formed at least one gas channel (20) which channel, in running towards the plain surface in outwardly slanting manner, terminates at one of its ends in at least one gas outlet opening in the plain surface (12), the at least one gas channel being connectable to a gas supply pipe (28) at its other end, wherein at least three guiding arms (30) are disposed adjacent the at least one gas outlet opening(s) outside the at least one gas outlet opening and wherein the at least three guiding arms project beyond the plain surface (12) of the support (10) and are adjustable radially with respect to the plain surface (12).

13 Claims, 1 Drawing Sheet

CONVEYING DEVICE FOR THIN DISK-LIKE ARTICLES

DESCRIPTION

The invention concerns a conveying device for thin disk-like articles.

In producing semi-conductors, so-called wafers (silicon disks) are used, onto which oxide, nitride, polysilicon and metal layers, above all, are first applied in variable order and repeatedly. During the further production process, these layers having often a thickness of only a few nanometers are etched off the front side mostly in areas and off the backside mostly totally. The etching may be of a dry or liquid type. In this context, the so-called spin etching technology (a rotational etching method) is known.

For this, the disk-like wafer to be treated is removed from a so-called wafer cassette and is placed upon a so-called chuck (a wafer supporting device), with the side to be protected facing downwards.

The etching process is effected in the chuck, several etching processes with different acid mixtures being carried out sequentially in the same chuck in modern systems.

After completion of the etching process, the wafer is removed from the chuck and is placed into another cassette.

The wafers (silicon disks) mentioned above are very thin (mostly less than 1.0 mm, often less than 0.2 mm thick) and are fabricated usually as circular disks.

The whole treatment as described above is effected under ultraclean conditions, because the slightest contamination would render the wafer useless otherwise.

In addition to this requirement, it has to be ensured that the wafer is not injured mechanically or bent during handling (during conveyance) and during treatment.

In this context, the AT 000 640 U1 proposes a gripper for semi-conductor wafers and other disk-like articles, which has gripper arms being guided in an inwardly and outwardly displaceable manner in a radial direction with respect to a main body. In sections, the gripper arms reach beyond the silicon disks at their edge, that is in being conveyed the disks lie on the gripping arms, at least in sections. Here, injuries of the surface or warpings (a wrinkling) of the disks may occur, in particular with very thin disks.

According to the U.S. Pat. No. 4,118,058 A, a tool for conveying disks in a contact-free manner is proposed, wherein a corresponding support has guiding surfaces at its edge for the disk to be placed upon. It is disadvantageous that even small dimensional tolerances of the disks to be conveyed either result in an uncontrolled lateral movement of the disk or the disk cannot be taken up at all.

It is the object of the invention to provide a device, by which thin disk-like articles may be conveyed as gently as possible without an impairment of their quality and shape.

In particular, the device is to be suitable for conveying the wafers mentioned above; in this respect, however, the invention is not subject to limitations of application.

The basic idea of the invention is to convey the disk-like articles largely in a contact-free manner (without mechanical contact areas). In that, the invention makes use of the so-called Bernoulli principle. Here, a gas cushion is formed between a support and the article to be treated, the gas flow being such that a low pressure is formed, at least in sections, between the support and the article, which provides that the article is sucked towards the surface of the support in maintaining a constant distance from the surface of the support.

So, on the one hand a pressurized gas is brought into a space between the support and the article and on the other hand a low pressure is established, so that conveyance of the article in a contact-free manner is made possible.

In order to ensure a positioning of the article with respect to the support as exactly as possible, there are provided additional guiding arms projecting beyond the surface of the support, facilitating an accurate centering of the wafer and thus preventing a lateral (radial) displacement of the article with respect to the support surface.

So, it is not the job of the guiding arms to grip the thin disk-like article (like the gripping arms according to AT 000 640 U1). They form adjustable circumferential alignment surfaces, alignment lines or preferably alignment points for the articles to be conveyed.

Accordingly, in its most general embodiment the invention concerns a conveying device for thin disk-like articles (called wafer in the following, but not in a limiting manner) having the following features:

- a support having a plain surface,
- in the support there are formed one or more gas channels which, in running towards the plain surface in outwardly slanting manner, terminate at one of their ends in (a) gas outlet opening(s) in the plain surface and are able to be connected to a gas supply pipe at their other end,
- at least three guiding arms are disposed adjacent the gas outlet opening(s) at the outside, which project beyond the plain surface of the support and are able to be adjusted radially with respect to the plain surface of the support.

The gas channel or channels serve for transporting a treating gas, for example nitrogen, into the region of the support surface (plain surface). They are slanting outwardly to establish the Bernoulli effect mentioned above. The article to be conveyed covers the gas outlet openings of the gas channel or gas channels, a gas cushion being formed accordingly between the outer edge region of the wafer and the plain surface of the support, while a low pressure is established between the "middle" portion of the wafer and the corresponding portion of the plain surface, which "secures" the wafer in spaced apart relationship from the surface of the support, as long as the pressure proportions between the wafer and the support surface are maintained.

According to an embodiment, the support is of two pieces. Between the two parts of the support a gas channel is formed, being tapered (enlarging towards the plain surface) according to the geometric setting.

Of course there has to be a mechanical connection between the support parts in this case. This connection may be formed by a pin which holds the two parts at the desired distance in forming the annular gap (gas channel). At the same time, this "pin" may serve as gas supply pipe having openings on the side, by which the gas flows into the gas channel, preferably in a rotationally symmetric manner.

An alternative embodiment provides a device having a one-piece support. In this case, a plurality of gas channels are provided in the support, which are arranged in spaced apart relationship, essentially in rotationally symmetric manner with respect to the longitudinal middle axis of the support. The gas channels extend in "star-like" manner and preferably with a very small distance between each other so that in this way, too, a "quasi-continuous" gas veil can be formed.

In particular, if—as usual—rotationally symmetric, above all circular, wafers are to be conveyed, the guiding arms are also to be arranged in rotationally symmetric manner with respect to the longitudinal middle axis of the support.

With regard to the design and the arrangement of the guiding arms, the invention presents different solutions.

According to an embodiment, the guiding arms are articulated to the support and each consists of a first inner portion extending from the support in an essentially perpendicular direction with respect to the longitudinal middle axis of the support, and an outer portion connected to the free end of the inner portion, which projects beyond the plain surface of the support.

In this case, the guiding arms are formed like the legs of a spider.

The outer portions of the guiding arms may extend essentially in parallel with the longitudinal middle axis of the support.

In order to keep the contact area of the outer surface of the wafer and the guiding arms as small as possible, a development provides to form the outer portions of the guiding arms as cylinders. If the cylinders extend exactly in parallel with the longitudinal middle axis of the support (and thus perpendicularly to the plain surface of the support and perpendicularly to the wafer, respectively), the maximum contact between the edge region of the wafer and the cylinders will have the shape of a line, if the outer surface of the wafer extends perpendicularly to the main surface, or only the shape of a point, if the outer surface (circumferential surface) of the wafer is bevelled.

If the outer portions of the guiding arms are formed having an arcuate surface, particularly like a ball, and the wafer is positioned exactly at the level of the center of the ball, in any case only point-shaped contact areas result between the wafer and the guiding arms.

It is sufficient, in particular with annular disks, to provide only three guiding arms which are offset at an angle of 120° from each other, for example. But it is also possible to provide more guiding arms, for example six guiding arms, then at an angle of 60° from each other.

Another constructive design provides to dispose the guiding arms in the edge region of the plain surface, that is outside the gas channel (the gas channels).

Here, these guiding arms may be formed in analogy to the outer portions of the above-mentioned guiding arms, that is for example like pins, cylinders or balls.

The guiding arms should be variable, that is in such a manner that they are adjustable in a plane in parallel with the support surface. An adaption of the position of the guiding arms to any geometry or dimensional tolerances of the wafers is made possible thereby. Accordingly, the guiding arms are moveable perpendicularly with respect to the longitudinal middle axis of the support or radially with respect to the support surface.

In an embodiment, in which the guiding arms or their portions acting on the wafer have a pin shape, that may be effected for example by an eccentric displacement (pivoting). Also, the guiding arms may be provided under an inward tension (in the direction towards the edge region of the wafer), that is with a very small tensile force.

The Bernoulli effect outlined above is optimized, if the gas channel or channels are tapered towards the end at the gas outlet. In the case of the described annular nozzle it is formed like a slit nozzle. In the case of separate gas channels they are truncated, for example, at their gas outlet end or they are slit-shaped too.

A substantial advantage of the device is that the wafers are not clamped any more. Accordingly, the wafers cannot become bent or wrinkled any more. It was even found that wafers being a little warped smooth out again in the device. Another advantage is that the wafers are "held" in a contact-free manner at a defined distance from the support surface in interposing a gas cushion. Here, it is important that a constant and at the same time small distance is formed between the wafer and the support surface.

The invention is explained in more detail below with an embodiment.

Figure 2:
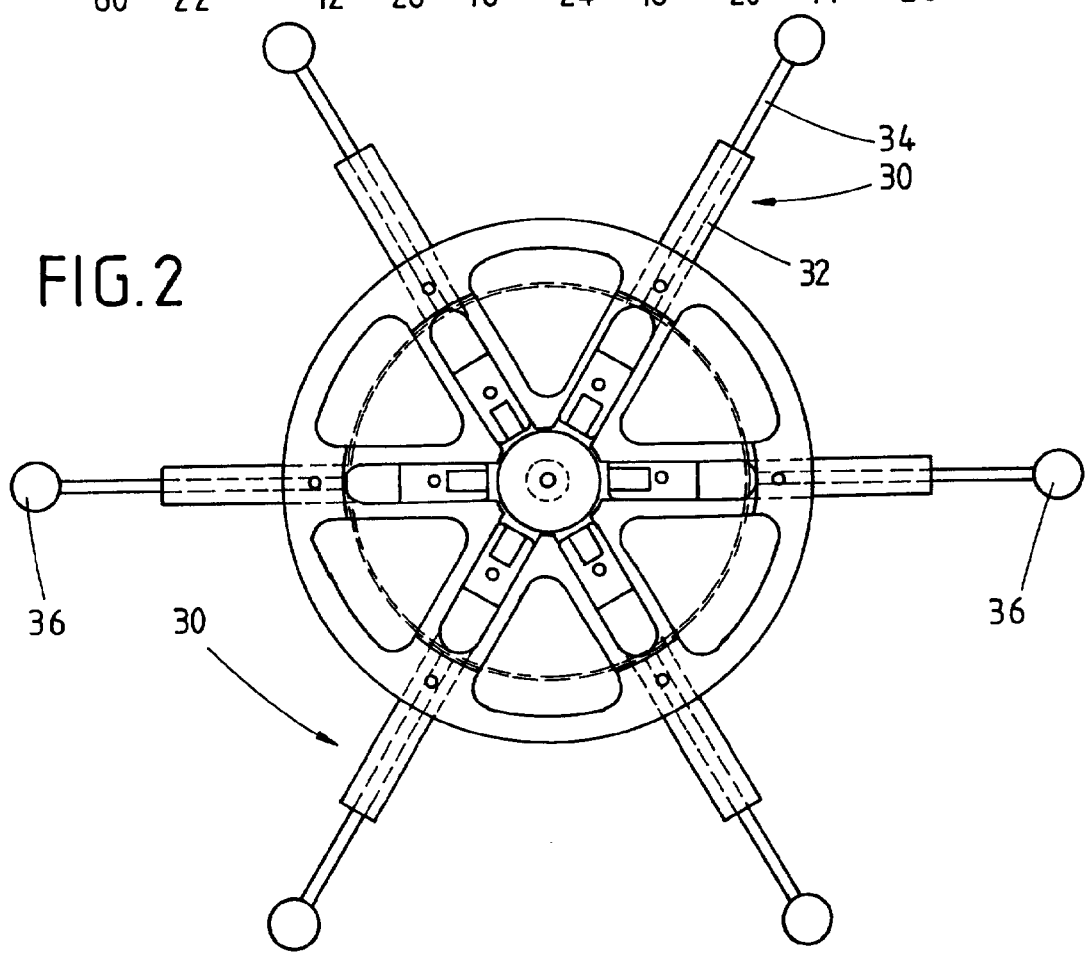

The figures show—each in schematic representation:

FIG. 1 a longitudinal section through the conveying device according to the invention, FIG. 2 a plan view (from above) of the guiding arms of the device.

In FIG. 1 the reference number 10 indicates a support of the device. This support has a plain surface 12. The surface 12 consists of two portions, an outer annular region 14 and an inner circular region 16. The circular region 16 is the surface of an insert 18 which is provided in a corresponding recess 24 of the main body 22 of the support 10 in forming an annular gap 20.

The insert 18 is connected to the main body 22 through three screws 26.

The annular gap 20 forms a gas channel, the end of which terminating in the surface 12 is formed tapering in a slit-like manner, and the other end of which communicates fluidically with a gas supply pipe 28 formed in the housing body 22, which can be connected to a source of compressed gas (not illustrated).

The surfaces of the insert 18 and the main body 22, respectively, that is the circular region 16 and the annular region 14, are aligned exactly in flush relationship and form together the plain surface 12 of the support 10.

As follows from the overall view of FIGS. 1 and 2, there are six guiding arms 30 extending through the main body 22, which are disposed at an angle of 60° from each other, respectively. Each guiding arm 30 consists of a first inner portion 32 extending from the support 10 in an essentially perpendicular direction with respect to the longitudinal middle axis M of the support, and an outer portion 36 connected to the free end 34 of the inner portion 32. The outer portions 36 extend perpendicularly with respect to the inner portions 30 and thus perpendicularly with respect to the surface 12 and in parallel with the longitudinal middle axis M of the support 10, respectively.

They are arranged in such a manner that the free cylindrical ends 38 project beyond the surface 12.

The inner portions 32 of the guiding arms 30 are guided through sleeves 40 which are secured in the housing body 22. The portions 32 are fixed to corresponding sliding bodies 44 with their inner ends 42. Compression springs 50 are provided on the portions 32 between the sliding bodies 44 lying in a recess 46 of the main body 22 and the opposing inner wall 48 of the main body 22. The sliding bodies 44 have recesses 52 on the inside, in which rollers 54 are provided, which cooperate with wedge-like adjustment bodies 56, which can be driven by a plunger 58 in the upper portion of the main body 22.

By an axial variation of the plunger 58, the adjustment bodies 56 are guided in the direction of the longitudinal middle axis M of the support 10 and with a movement towards the surface 12, the guiding arms 30 are accordingly moved radially outwardly. When the plunger 58 is returned, the compression springs 50 provide that the guiding arms 30 are moved back inwardly.

The support 10 is secured to a manipulator (not illustrated), which moves the support 10 to the desired position where a wafer is taken up, and guides it to another position where the wafer is laid down again.

The function of the device is the following:

The wafer 60 lying, for example, on a chuck is covered by the device (as illustrated in FIG. 1). The gas supply is turned on and gas is flowing out through the gas supply pipe 28 and the gas channel (annular gap 20). In correspondence with the outwardly slanting inclined shape of the annular gap 20 as well, the gas flows under a sharp angle alpha with respect to the surface 12 towards the wafer 60. In this way the wafer 60 is first held at a distance from the surface 12. At the same time, a low pressure forms "within" the annular gas veil, that is particularly between the circular region 16 and the corresponding portion of the wafer 60 (so-called Bernoulli effect), which holds the wafer 60 at a defined distance from the surface 12 or draws it to the surface.

Now the support may be lifted through the manipulator, taking along the wafer in a contact-free manner. The manipulator may be any means, perferably controlled electronically, for example a so-called handling robot.

The guiding arms 30 or their cylindrical ends 38, which delimit the wafer 60 at its edge (if necessary, after an appropriate adjustment), serve for security, in order to prevent a lateral "drifting" of the wafer 60. Usually, no working contact will occur between the edge region of the wafer 60 and the cylindrical ends 38. But if the wafer 60 should move in radial direction (during the grabbing process or the conveyance), the wafer may rest "softly" against the cylindrical ends 38 in points, at the most.

Then, the wafer will be laid down in a cassette, for example.

What is claimed is:

1. A conveying device for thin disk-like articles (60), characterized by the following features:

a support (10) having a plain surface (12), in the support (10) there is formed at least one gas channel (20) which channel, in running towards the plain surface in outwardly slanting manner, terminates at one of its ends in at least one gas outlet opening in the plain surface (12), said at least one gas channel being connectable to a gas supply pipe (28) at its other end, wherein at least three guiding arms (30) are disposed adjacent the at least one gas outlet opening outside said at least one gas outlet opening and wherein said at least three guiding arms project beyond the plain surface (12) of the support (10) and are adjustable radially with respect to the plain surface (12).

2. The device according to claim 1, characterized by a two-piece support (18, 22) and an essentially tapered annular gap (20) formed between the support pieces (18, 22).

3. The device according to claim 1, characterized in that the guiding arms (30) are arranged in a rotationally symmetric manner with respect to a longitudinal middle axis (M) of the support (10).

4. The device according to claim 1, characterized in that the guiding arms (30) are articulated to the support (10) and each of them consists of a first inner portion (32) extending from the support (10) in an essentially perpendicular direction with respect to a longitudinal middle axis (M) of the support (10), and an outer portion (36) connected to a free end (34) of the inner portion (32), which projects beyond the plain surface (12) of the support (10).

5. The device according to claim 4, characterized in that the outer portion (36) of the guiding arms (30) extend essentially in parallel with a longitudinal middle axis (M) of the support (10).

6. The device according to claim 4, characterized in that the outer portions (36) are cylindrical.

7. The device according to claim 1, characterized in that the guiding arms project from an edge portion of the plain surface outside the gas channel.

8. The device according to claim 7, characterized in that the guiding arms are cylindrical at least at a free end of said guiding arms.

9. The device according to claim 7, characterized in that the guiding arms are ball-shaped at least at a free end of said guiding arms.

10. The device according to claim 1, characterized in that the guiding arms (30) are arranged to move towards a longitudinal middle axis (M) of the support (10).

11. The device according to claim 10, characterized in that the guiding arms (30) are provided under a tension.

12. The device according to claim 1, characterized in that the support (10) has a circular plain surface (14, 16).

13. The device according to claim 1, characterized in that the at least one gas channel is slit-shaped in the region of the gas outlet opening.

* * * * *